(12) United States Patent
Luo

(10) Patent No.: US 12,433,024 B2
(45) Date of Patent: Sep. 30, 2025

(54) ARRAY SUBSTRATE AND PREPARATION METHOD THEREOF, AND DISPLAY PANEL

(71) Applicant: WUHAN CHINA STAR OPTOELECTRONICS TECHNOLOGY CO., LTD., Hubei (CN)

(72) Inventor: Chengzhi Luo, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 706 days.

(21) Appl. No.: 17/781,309

(22) PCT Filed: May 30, 2022

(86) PCT No.: PCT/CN2022/095980
§ 371 (c)(1),
(2) Date: May 31, 2022

(87) PCT Pub. No.: WO2023/221166
PCT Pub. Date: Nov. 23, 2023

(65) Prior Publication Data
US 2023/0378185 A1    Nov. 23, 2023

(30) Foreign Application Priority Data
May 18, 2022   (CN) .......................... 202210547754.3

(51) Int. Cl.
*H10D 86/60* (2025.01)
*H10D 86/01* (2025.01)
*H10D 86/40* (2025.01)

(52) U.S. Cl.
CPC ......... *H10D 86/60* (2025.01); *H10D 86/0221* (2025.01); *H10D 86/421* (2025.01)

(58) Field of Classification Search
CPC .. H10D 86/60; H10D 86/0221; H10D 86/421; H10D 30/6723; H10K 59/60
(Continued)

(56) References Cited

U.S. PATENT DOCUMENTS

2014/0042429 A1* 2/2014 Park ................... H10D 30/0314
                                                     257/288
2020/0168687 A1   5/2020 Hu et al.
(Continued)

FOREIGN PATENT DOCUMENTS

CN       104022156 A      9/2014
CN       108573981 A      9/2018
(Continued)

OTHER PUBLICATIONS

International Search Report issued in corresponding International application No. PCT/CN2022/095980, mailed on Dec. 21, 2022, 8 pages, machine translation provided.
(Continued)

*Primary Examiner* — Fernando L Toledo
*Assistant Examiner* — Ashley Nicole Blackwell
(74) *Attorney, Agent, or Firm* — HSML P. C.

(57) ABSTRACT

Embodiments of the present disclosure provide an array substrate, a preparation method thereof, and a display panel, where the array substrate includes a first filter layer, an active layer, and a second filter layer. By reflecting the light to the second filter layer through the first filter layer, and then reflecting the light to the active layer through the second filter layer, the active layer can act as a photosensitive unit to meet a requirement for detecting an ultraviolet intensity in the ambient light.

17 Claims, 8 Drawing Sheets

(58) Field of Classification Search
USPC .......................................................... 257/59
See application file for complete search history.

(56) References Cited

U.S. PATENT DOCUMENTS

| | | | |
|---|---|---|---|
| 2021/0167156 A1* | 6/2021 | Sun | H10D 30/6723 |
| 2021/0296364 A1* | 9/2021 | Shin | H10K 59/131 |
| 2021/0335848 A1* | 10/2021 | Zhang | H01L 25/167 |

FOREIGN PATENT DOCUMENTS

| | | |
|---|---|---|
| CN | 110400811 A | 11/2019 |
| CN | 111933665 A | 11/2020 |
| CN | 113113429 A | 7/2021 |
| CN | 113191190 A | 7/2021 |
| CN | 113421886 A | 9/2021 |
| CN | 114447117 A | 5/2022 |
| JP | 2004179450 A | 6/2004 |
| JP | 2004214691 A | 7/2004 |
| WO | 2020024292 A1 | 2/2020 |

OTHER PUBLICATIONS

Written Opinion of the International Search Authority issued in corresponding International application No. PCT/CN2022/095980, mailed on Dec. 21, 2022, 10 pages, machine translation provided.
Chinese Office Action issued in corresponding Chinese Patent Application No. 202210547754.3, dated Jun. 9, 2025, with English translation.

* cited by examiner

ARRAY SUBSTRATE AND PREPARATION METHOD THEREOF, AND DISPLAY PANEL

TECHNICAL FIELD

The present disclosure relates to a display technology field, and more particularly to an array substrate, a method for preparing the array substrate, and a display panel.

BACKGROUND

With the development of display technology, planar display devices such as liquid crystal displays (LCDs) and organic light emitting diodes (OLEDs) are widely used in various consumer electronic products such as mobile phones, televisions, personal digital assistants, digital cameras, notebook computers, and desktop computers and become mainstream in a display device due to their advantages such as a high image quality, power saving, a thin body, and a wide application range. In addition to requirements for a high resolution, a wide viewing angle, a low power consumption, and the like of a display, other requirements for the display panel are proposed. It is one of main development directions of a current display panel to enrich functions of the display panel, increase man-machine interaction, and improve the competitiveness of the display panel.

Photodetectors such as optical fingerprints, ambient light sensors, and ultraviolet light sensors are a relatively hot development direction at present. At present, semiconductor materials commonly used in the photodetectors include amorphous silicon, microcrystalline silicon, polycrystalline silicon, etc., but these materials have a narrow band gap and a poor photodetection selectivity. Therefore, these materials have some limitations in practical applications. At present, the polycrystalline silicon is commonly used to prepare an ultraviolet light detector, but it has a response to both visible light and ultraviolet light. Therefore, the selectivity for ultraviolet light detection is poor, and thus a filter is required to be introduced. However, the cost of a usual filter is high, and the selection ratio for the ultraviolet light/the visible light is not high enough.

Therefore, an improvement is urgently needed for defects existing in the prior art.

TECHNICAL PROBLEMS

Embodiments of the present disclosure provide an array substrate, a method for preparing the array substrate, and a display panel to improve a problem that an ultraviolet light detection structure in the current display panel is complex and its production process is cumbersome.

TECHNICAL SOLUTIONS TO THE PROBLEMS

To achieve above effects, an embodiment of the present disclosure provides an array substrate, including a base substrate; a first buffer layer disposed on a side of the base substrate and having a groove; a first filter layer disposed on a side of the first buffer layer away from the base substrate and covering the groove; an active layer disposed on a side of the first filter layer away from the first buffer layer and in correspondence with the first filter layer; and a second filter layer disposed on a side of the active layer away from the first filter layer and in correspondence with the active layer; wherein an orthographic projection of the active layer on the base substrate is within an orthographic projection of the first filter layer on the base substrate.

Alternatively, in some embodiments of the present disclosure, the groove has an inverse trapezia section, and a range of an angle between a sidewall of the groove and the base substrate is 0 to 60 degrees.

Alternatively, in some embodiments of the present disclosure, the first filter layer includes at least one first metal layer and at least one first metal oxide layer, wherein the first metal layer is disposed close to the first buffer layer; and the second filter layer includes at least one second metal layer and at least one second metal oxide layer, wherein the second metal oxide layer is disposed close to the active layer.

Alternatively, in some embodiments of the present disclosure, materials of the first metal layer and the second metal layer include titanium; and the materials of the first metal oxide layer and the second metal oxide layer include titanium oxide.

Alternatively, in some embodiments of the present disclosure, both the first metal layer and the second metal layer have a thickness ranging from 40 nm to 300 nm; and both the first metal oxide layer and the second metal oxide layer have a thickness ranging from 10 nm to 500 nm.

Alternatively, in some embodiments of the present disclosure, an orthographic projection of the second filter layer on the base substrate is within an orthographic projection of the first filter layer on the base substrate; and an orthographic projection of the second filter layer on the active layer covers at least a portion of the active layer.

Alternatively, in some embodiments of the present disclosure, a shape of an orthographic projection of the second filter layer on the base substrate includes a cross shape; the orthographic projection of the second filter layer on the base substrate exposes four corners of the orthographic projection of the active layer on the base substrate; and a source/drain is connected to the active layer at positions of the four corners.

Alternatively, in some embodiments of the present disclosure, the array substrate further includes: a second buffer layer disposed on a side of the first filter layer away from the first buffer layer and covering the first buffer layer and the first filter layer; a gate insulation layer disposed on a side of the active layer away from the second buffer layer and covering the second buffer layer and the active layer; a gate disposed on a side of the gate insulation layer away from the active layer and in correspondence with the active layer; an interlayer insulation layer disposed on a side of the gate away from the gate insulation layer and covering the gate insulation layer and the gate; a source/drain disposed on a side of the interlayer insulation layer away from the gate, and connected to the active layer through a via passing through the interlayer insulation layer and the gate insulation layer; and a flat layer disposed on a side of the second filter layer away from the interlayer insulation layer and covering the interlayer insulation layer, the second filter layer, and the source/drain.

Correspondingly, an embodiment of the present disclosure further provide a method for preparing the array substrate according to any of the above embodiments, including: providing a base substrate; depositing an insulating material on the base substrate, and patterning the insulating material to form a groove, so as to form a first buffer layer; depositing a metal material and a metal oxide material on the first buffer layer, respectively, and patterning the metal material and the metal oxide material to form a first filter layer, wherein the first filter layer covers the groove; depositing a polysilicon material on the first filter layer, and patterning the polysilicon material to form an active layer, wherein the active layer is correspondingly formed right above the first filter layer, and an orthographic projection of the active layer on the base substrate is within an orthographic projection of the first filter layer on the base substrate; depositing a metal oxide material and a metal material on the active layer, respectively, and patterning the metal oxide material and the metal material to form a second filter layer such that an orthographic projection of the second filter layer on the active layer covers at least a portion of the active layer.

Correspondingly, an embodiment of the present disclosure further provide a display panel including an array substrate and an opposing substrate disposed opposite to the array substrate.

Alternatively, in some embodiments of the present disclosure, the array substrate includes: a base substrate; a first buffer layer disposed on a side of the base substrate and having a groove; a first filter layer disposed on a side of the first buffer layer away from the base substrate and covering the groove; an active layer disposed on a side of the first filter layer away from the first buffer layer and in correspondence with the first filter layer; a second filter layer disposed on a side of the active layer away from the first filter layer and in correspondence with the active layer; and a source/drain disposed on a side of the active layer away from the first filter layer and connected to the active layer through a via; wherein an orthographic projection of the active layer on the base substrate is within an orthographic projection of the first filter layer on the base substrate; and the second filter layer is disposed on the same layer as the source/drain.

Alternatively, in some embodiments of the present disclosure, the groove has an inverse trapezia section, and a range of an angle between a sidewall of the groove and the base substrate is 25 to 45 degrees.

Alternatively, in some embodiments of the present disclosure, the first filter layer includes at least one first metal layer and at least one first metal oxide layer, wherein the first metal layer is disposed close to the first buffer layer.

Alternatively, in some embodiments of the present disclosure, a material of the first metal layer includes titanium, and a material of the first metal oxide layer includes titanium oxide; the first metal layer has a thickness ranging from 50 nm to 200 nm; and the first metal oxide layer has a thickness ranging from 20 nm to 400 nm.

Alternatively, in some embodiments of the present disclosure, the second filter layer includes at least one second metal layer and at least one second metal oxide layer, wherein the second metal oxide layer is disposed close to the interlayer insulation layer.

Alternatively, in some embodiments of the present disclosure, a material of the second metal layer includes titanium, and a material of the second metal oxide layer includes titanium oxide; the second metal layer has a thickness ranging from 50 nm to 200 nm; and the second metal oxide layer has a thickness ranging from 20 nm to 400 nm.

Alternatively, in some embodiments of the present disclosure, an orthographic projection of the second filter layer on the base substrate is within an orthographic projection of the first filter layer on the base substrate; and an orthographic projection of the second filter layer on the active layer covers at least a portion of the active layer.

Alternatively, in some embodiments of the present disclosure, an orthographic projection of the source/drain on the base substrate is within an orthographic projection of the first filter layer on the base substrate; and an orthographic projection of the source/drain on the active layer covers at least a portion of the active layer.

Alternatively, in some embodiments of the present disclosure, the array substrate further includes: a second buffer layer disposed on a side of the first filter layer away from the first buffer layer and covering the first buffer layer and the first filter layer; a gate insulation layer disposed on a side of the active layer away from the second buffer layer and covering the second buffer layer and the active layer; a gate disposed on a side of the gate insulation layer away from the active layer and in correspondence with the active layer; an interlayer insulation layer disposed on a side of the gate away from the gate insulation layer and covering the gate insulation layer and the gate; and a flat layer disposed on a side of the second filter layer away from the interlayer insulation layer and covering the interlayer insulation layer, the second filter layer, and the source/drain.

Alternatively, in some embodiments of the present disclosure, a shape of an orthographic projection of the second filter layer on the base substrate includes a cross shape; the orthographic projection of the second filter layer on the base substrate exposes four corners of the orthographic projection of the active layer on the base substrate; and a source/drain is connected to the active layer at positions of the four corners.

BENEFICIAL EFFECTS

Embodiments of the present disclosure provide the array substrate including the base substrate, the first buffer layer, the first filter layer, the second buffer layer, the active layer, the gate insulation layer, the gate, the interlayer insulation layer, the second filter layer, the source/drain, and the flat layer that are sequentially disposed in a laminated manner. By integrating the first filter layer and the second filter layer to the array substrate, ambient light can be incident on the array substrate. By first reflecting the light to the second filter layer through the first filter layer, and then reflecting the light to the active layer through the second filter layer, the active layer can act as a photosensitive unit to meet a requirement for detecting an ultraviolet intensity in the ambient light. The present disclosure can directly prepare the ultraviolet detection structure on the array substrate, so there is no need to perform a process of fixing the ultraviolet detection structure to the display device, thereby avoiding a risk of damage to the display device during the fixing process, and solving a problem that the current ultraviolet detection requires a filter to be introduced. The preparation process of the present disclosure is simpler, thereby saving a production cost.

Further, the first buffer layer is provided with the groove, the orthographic projection of the active layer on the base substrate is located in the orthographic projection of the first filter layer on the base substrate, and the second filter layer is disposed in correspondence with the active layer. That is, the orthographic projection of the second filter layer on the base substrate is located in the orthographic projection of the first filter layer on the base substrate. When the groove has the inverse trapezia section, the outer periphery of the first filter layer has an inclined surface which serves to converge light. That is, it is easier to reflect the ambient light to the second filter layer, and reflecting more light can absorb more ambient light on the active layer, thereby realizing the need for detecting the ultraviolet intensity in the ambient light.

BRIEF DESCRIPTION OF THE DRAWINGS

In order to more clearly illustrate the technical solutions in embodiments of the present disclosure, the accompanying drawings depicted in the description of the embodiments will be briefly described below. It will be apparent that the accompanying drawings in the following description are merely some embodiments of the present disclosure, and other drawings may be obtained from these drawings without creative effort by those skilled in the art.

DESCRIPTION OF MAIN REFERENCE SIGNS

Figure 1:
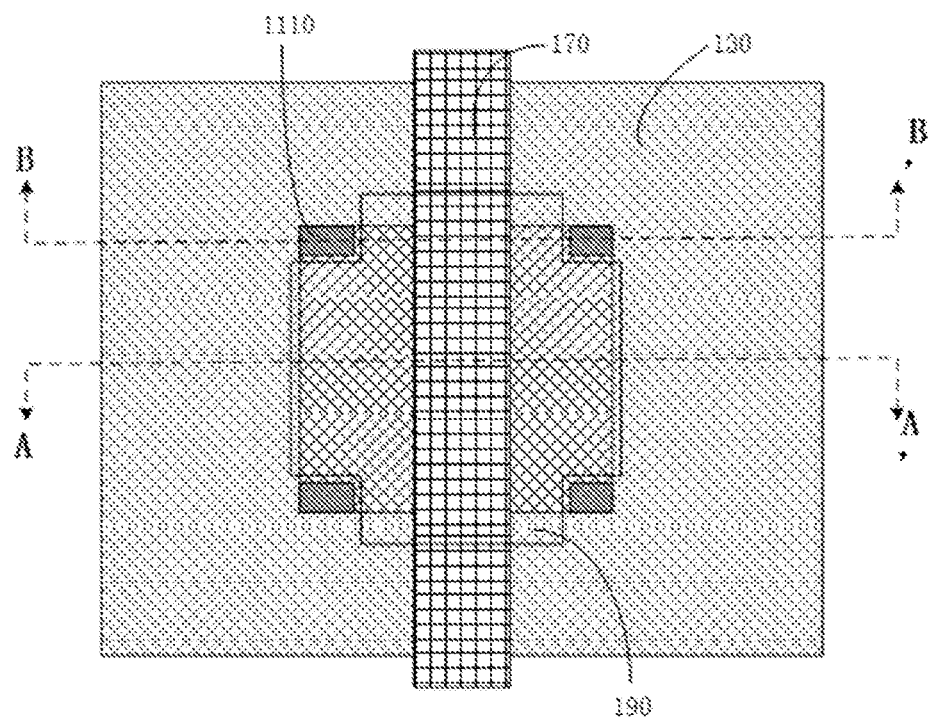
FIG. 1 is a schematic plan view of a partial structure of an array substrate according to an embodiment of the present disclosure.

| reference sign | component name | reference sign | component name |
|---|---|---|---|
| 1 | display panel | 160 | gate insulation layer |
| 10 | array substrate | 170 | gate |
| 110 | base substrate | 180 | interlayer insulation layer |
| 120 | first buffer layer | 190 | second filter layer |
| 130 | first filter layer | 191 | second metal layer |
| 131 | first metal layer | 192 | second metal oxide layer |
| 132 | first metal oxide layer | 1110 | source/drain layer |
| 140 | second buffer layer | 1120 | flat layer |
| 150 | active layer | 20 | opposing substrate |

Embodiments of the Present Disclosure

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure. In addition, it should be understood that the specific implementations described here are only used to illustrate and explain the present disclosure, and are not used to limit the present disclosure. In the present disclosure, unless otherwise stated, directional words used such as "upper", "lower", "left", and "right" generally refer to the directions of the device in actual use or working state, and may refer to the drawing directions in the drawings or may refer to two opposite directions; and "inner" and "outer" refer to the outline of the device.

Figure 2:
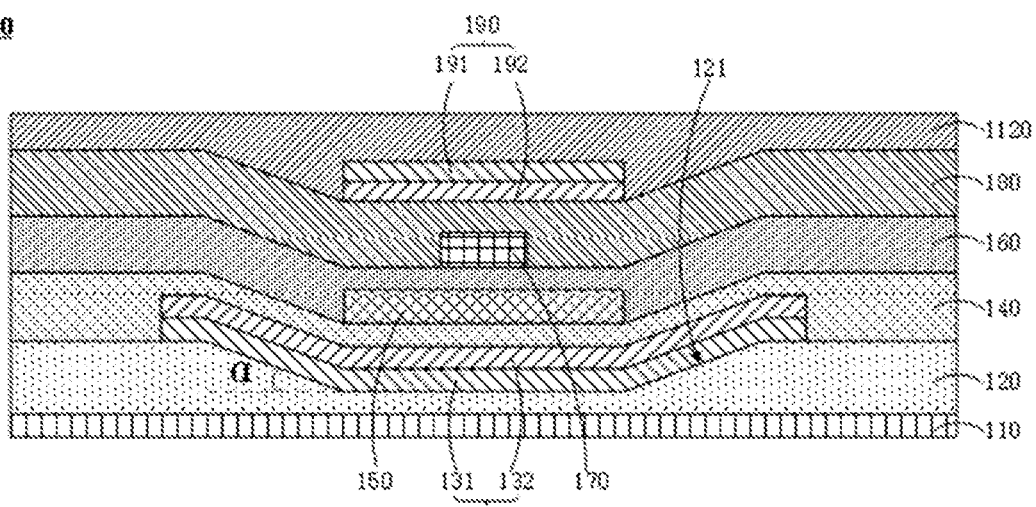
FIG. 2 is a cross-sectional view taken alone the line A-A' of the array substrate in FIG. 1.
Figure 3:
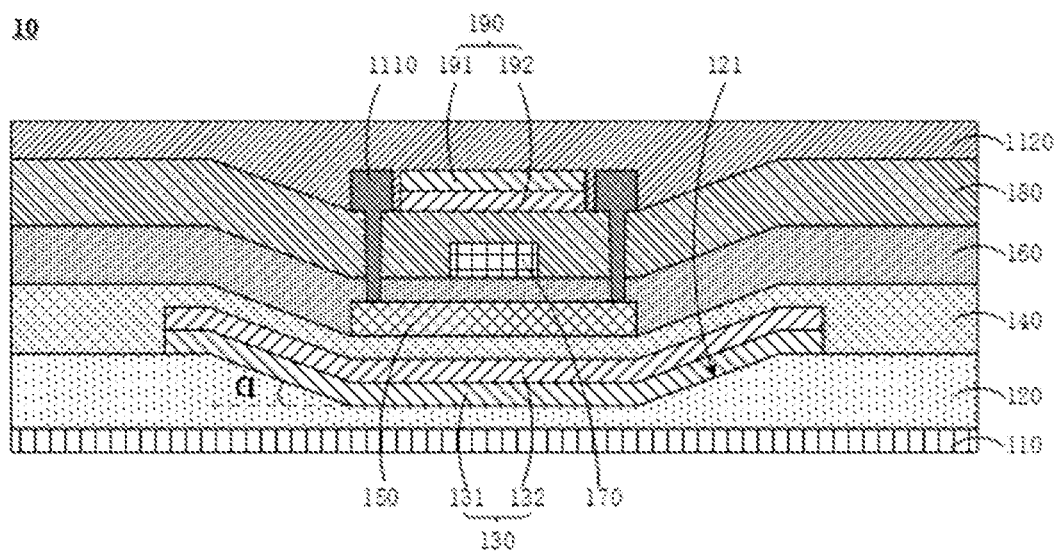
FIG. 3 is a cross-sectional view taken alone the line B-B' of the array substrate in FIG. 1.

Referring to FIGS. 1-3, an embodiment of the present disclosure provides an array substrate including a base substrate 110, a first buffer layer 120, a first filter layer 130, a second buffer layer 140, an active layer 150, a gate insulation layer 160, a gate 170, an interlayer insulation layer 180, a second filter layer 190, a source/drain 1110, and a flat layer 1120 that are sequentially disposed in a laminated manner. Specifically, the first buffer layer 120 is disposed on a side of the base substrate 110 and has a groove 121; the first filter layer 130 is disposed on a side of the first buffer layer 120 away from the base substrate 110 and covers the groove 121; the second buffer layer 140 is disposed on a side of the first filter layer 130 away from the first buffer layer 120, and covers the first buffer layer 120 and the first filter layer 130; the active layer 150 is disposed on a side of the second buffer layer 140 away from the first filter layer 130 and in correspondence with the first filter layer 130; the gate insulation layer 160 is disposed on a side of the active layer 150 away from the second buffer layer 140, and covers the second buffer layer 140 and the active layer 150; the gate 170 is disposed on a side of the gate insulation layer 160 away from the active layer 150, and in correspondence with the active layer 150; the interlayer insulation layer 180 is disposed on a side of the gate 170 away from the gate insulation layer 160, and covers the gate insulation layer 160 and the gate 170; the second filter layer 190 is disposed on a side of the interlayer insulation layer 180 away from the gate 170 and in correspondence with the active layer 150; and the source/drain 1110 is disposed on the same layer as the second filter layer 190, and connected to the active layer 150 through a via passing through the interlayer insulation layer 180 and the gate insulation layer 160; where an orthographic projection of the active layer 150 on the base substrate 110 is within an orthographic projection of the first filter layer 130 on the base substrate 110.

By integrating the first filter layer 130 and the second filter layer 190 to the array substrate in the present embodiment, ambient light can be incident on the array substrate. By first reflecting the light to the second filter layer 190 through the first filter layer 130, and then reflecting the light to the active layer 150 through the second filter layer, the active layer 150 can act as a photosensitive unit to meet the requirement for detecting an ultraviolet intensity in the ambient light, where, the material of the active layer 150 is preferably a wide band gap semiconductor material, for example, the wide band gap semiconductor material is zinc oxide or indium gallium zinc oxide. The present disclosure can directly prepare the ultraviolet detection structure on the array substrate, so there is no need to perform a process of fixing the ultraviolet detection structure to the display device, thereby avoiding a risk of damage to the display device during the fixing process, and solving a problem that the current ultraviolet detection requires a filter to be introduced. The preparation process of the present disclosure is simpler, thereby saving a production cost.

In some embodiments, the groove 121 has an inverse trapezia section, and a range of an angle between a sidewall of the groove 121 and the base substrate 110 is 0 to 60 degrees, for example, 10°, 15°, 20°, 25°, 30°, 35°, 40°, 45°, 50°, or 55°. Preferably, the range of the angle between the sidewall of the groove 121 and the base substrate 110 is 25 to 45 degrees. It can be understood that the orthographic projection of the active layer 150 on the base substrate 110 is located in the orthographic projection of the first filter layer 130 on the base substrate 110, and the second filter layer 190 is disposed in correspondence with the active layer 150. That is, the orthographic projection of the second filter layer 190 on the base substrate 110 is located in the orthographic projection of the first filter layer 130 on the base substrate 110. When the groove 121 has the inverse trapezia section, the outer periphery of the first filter layer 130 has an inclined surface which serves to converge light. That is, it is easier to reflect the ambient light to the second filter layer 190, and reflecting more light can absorb more ambient light on the active layer 150, thereby realizing the need for detecting the ultraviolet intensity in the ambient light. In the present disclosure, the range of the angle between the sidewall of the groove 121 and the base substrate 110 is 0 to 60 degrees, so that a reasonable use of the ambient light can be achieved and the area of the second filter layer 190 can be reduced.

In the embodiment, the first filter layer 130 and the second filter layer 190 are composite film layers. The first filter layer 130 includes at least one first metal layer 131 and at least one first metal oxide layer 132, where the first metal layer 131 is disposed close to the first buffer layer 120; and the second filter layer 190 includes at least one second metal layer 191 and at least one second metal oxide layer 192, where the second metal oxide layer 192 is disposed close to the interlayer insulation layer 180. Materials of the first metal layer 131 and the second metal layer 191 include titanium; and materials of the first metal oxide layer 132 and the second metal oxide layer 192 include titanium oxide. It can be understood that lamination of metallic titanium and titanium oxide can have different reflection effects on light of different wavelengths. When a wavelength range of the ambient light is less than 380 nm, the reflectivity thereof is about 65%. When the wavelength range of the ambient light is between 380 nm and 780 nm, the reflectance thereof is about 10%. That is, in the present disclosure, the reflectivity of either the first filter layer 130 or the second filter layer 190 for the ultraviolet light is about 65%, and the reflectivity of either the first filter layer 130 or the second filter layer 190 for the visible light is about 10%. It can be understood that, in the present disclosure, the ambient light is reflected to the active layer 150 by twice reflection of the first filter layer 130 and the second filter layer 190. That is, finally the ultraviolet light is about 42% of the original intensity and the visible light is about 1% of the original intensity in the ambient light sensed on the active layer 150, and the selection ratio of the ultraviolet light to the visible light reaches 42:1. Such a high selection ratio can achieve a good ultraviolet detection performance. Further, since the reflectivity of the first filter layer 130 for the visible light is about 10%, the orthographic projection of the active layer 150 on the base substrate 110 is within the orthographic projection of the first filter layer 130 on the base substrate 110. At this time, the light generated by a backlight source is blocked by the first filter layer 130, so that the light is not irradiated on the active layer 150, thereby eliminating the influence of the backlight source on the detection of the ultraviolet light.

Preferably, both the first metal layer 131 and the second metal layer 191 have a thickness ranging from 40 nm to 300 nm. Both the first metal oxide layer 132 and the second metal oxide layer 192 have a thickness ranging from 10 nm to 500 nm. For example, the thickness of either the first metal layer 131 or the second metal layer 191 is 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, or 290 nm, but is not limited thereto. The thickness of either the first metal oxide layer 132 or the second metal oxide layer 192 is 10 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 310 nm, 320 nm, 330 nm, 340 nm, 350 nm, 360 nm, 370 nm, 380 nm, 390 nm, 400 nm, 410 nm, 420 nm, 430 nm, 440 nm, 450 nm, 460 nm, 470 nm, 480 nm or 490 nm, but is not limited thereto. Preferably, the thickness of the first metal layer 131 is the same as that of the second metal layer 191, and the thickness of the first metal oxide layer 132 is the same as that of the second metal oxide layer 192, so that the light can be reflected more uniformly.

As shown in FIG. 1, in an embodiment, the orthographic projection of the second filter layer 190 on the base substrate 110 is within the orthographic projection of the first filter layer 130 on the base substrate 110, and the orthographic projection of the second filter layer 190 on the active layer 150 covers at least a portion of the active layer 150. A shape of the orthographic projection of the second filter layer 190 on the base substrate includes a cross shape, the orthographic projection of the second filter layer 190 on the base substrate 110 exposes four corners of the orthographic projection of the active layer 150 on the base substrate 110; and a source/drain 1110 is connected to the active layer 150 at positions of the four corners. With this arrangement, the light reflected to the second filter layer 190 can be reflected to the active layer 150 as much as possible without affecting the film layer connection of the active layer 150, thereby realizing full utilization of light rays.

Referring to FIGS. 4 to 15, an embodiment of the present disclosure further provides a method for manufacturing the array substrate 10, including following steps S1 to S11.

Figure 4:
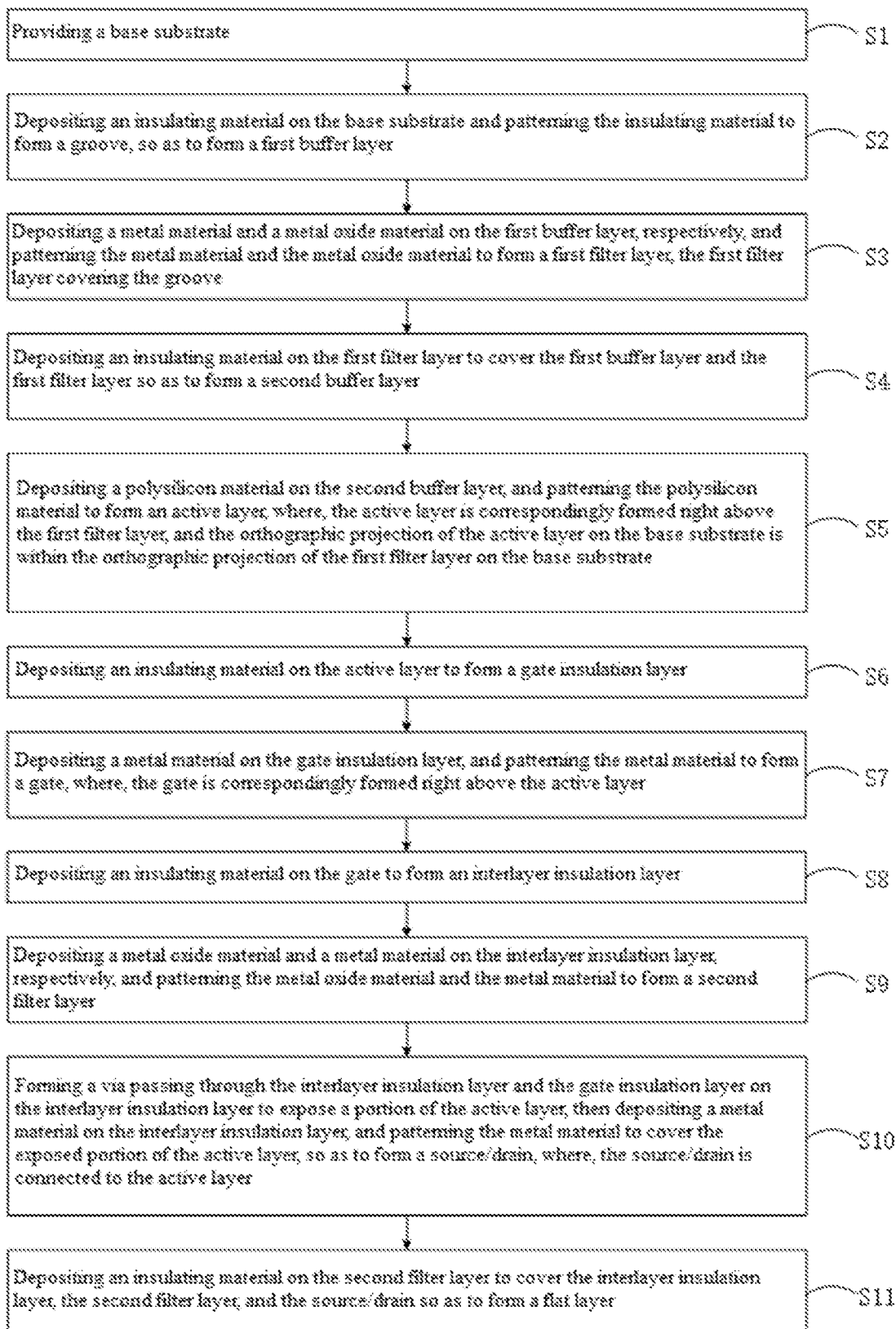
FIG. 4 is a flowchart of a method for preparing an array substrate according to an embodiment of the present disclosure.
Figure 5:
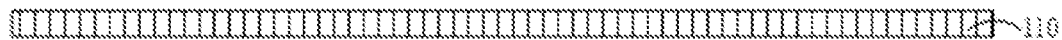
FIGS. 5 to 15 are schematic structural diagrams of various steps in a method for preparing an array substrate according to an embodiment of the present disclosure.

As shown in FIGS. 4 and 5, a step S1 of providing a base substrate 110, where, the base substrate 110 may be a flexible substrate, a glass substrate, or a flexible substrate, and a preparation material of the flexible substrate may include, but not limited to, polyimide and polyethylene terephthalate.

Figure 6:
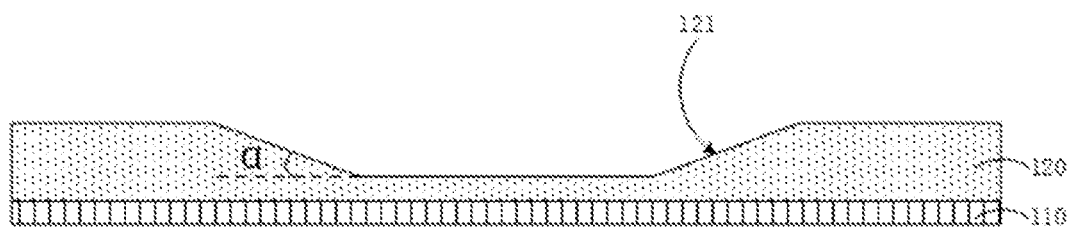

As shown in FIGS. 4 and 6, a step S2 of depositing an insulating material on the base substrate 110 and patterning the insulating material to form a groove 121, so as to form a first buffer layer 120, where, the first buffer layer 120 is used for insulation and is any one of a silicon nitride layer, a silicon oxide layer, or an overlapping layer of silicon nitride and silicon oxide. Preferably, the first buffer layer 120 employs the silicon nitride.

Figure 7:
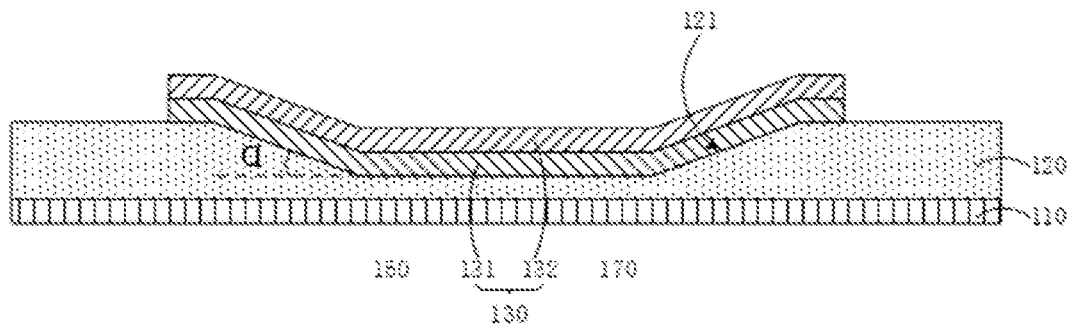

As shown in FIGS. 4 and 7, a step S3 of depositing a metal material and a metal oxide material on the first buffer layer 120, respectively, and patterning the metal material and the metal oxide material to form a first filter layer 130, where, the first filter layer 130 covers the groove 121, and a range of an angle between a sidewall of the groove 121 and the base substrate 110 is 0 to 60 degrees. The first filter layer 130 includes at least one first metal layer 131 and at least one first metal oxide layer 132, where, the first metal layer 131 is disposed close to the first buffer layer 120. The material of the first metal layer 131 includes titanium, and the material of the first metal oxide layer 132 includes titanium oxide.

Figure 8:
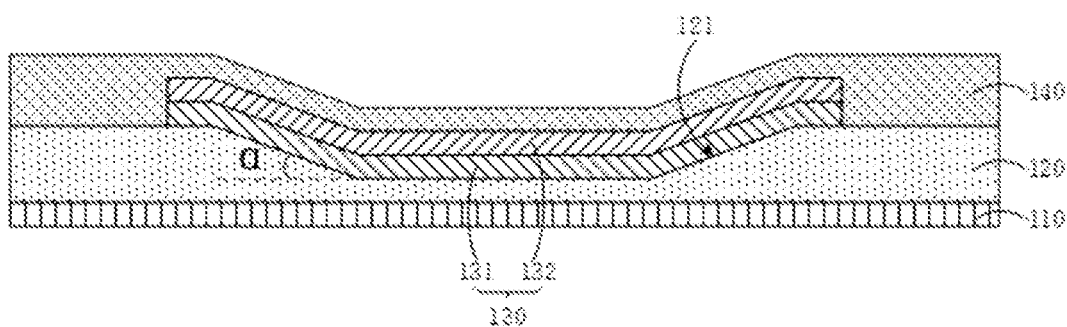

As shown in FIGS. 4 and 8, a step S4 of depositing an insulating material on the first filter layer 130 to cover the first buffer layer 120 and the first filter layer 130 so as to form a second buffer layer 140, where, the second buffer layer 140 is used for insulation and is any one of a silicon nitride layer, a silicon oxide layer, or an overlapping layer of silicon nitride and silicon oxide. Preferably, the second buffer layer 140 employs the silicon oxide.

Figure 9:
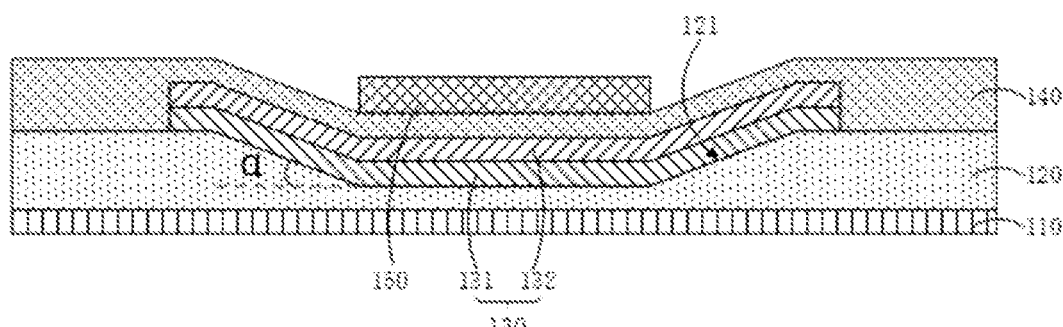

As shown in FIGS. 4 and 9, a step S5 of depositing a polysilicon material on the second buffer layer 140, and patterning the polysilicon material to form an active layer 150, where, the active layer 150 is correspondingly formed right above the first filter layer 130, and the orthographic projection of the active layer 150 on the base substrate 110 is within the orthographic projection of the first filter layer on the base substrate. The material of the active layer 150 is preferably a wide band gap semiconductor material. For example, the wide band gap semiconductor material is zinc oxide or indium gallium zinc oxide, and the active layer 150 can act as a photosensitive unit to meet the requirement for detecting an ultraviolet intensity in the ambient light.

Figure 10:
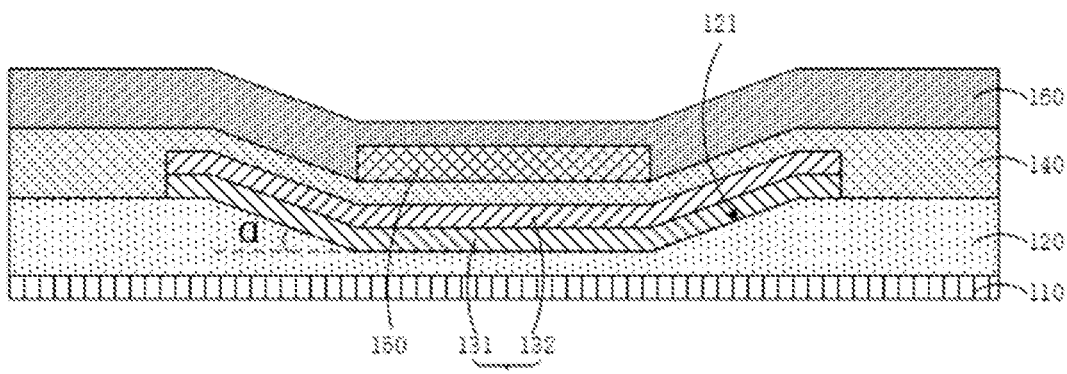

As shown in FIGS. 4 and 10, a step S6 of depositing an insulating material on the active layer 150 to form a gate insulation layer 160, where, the gate insulation layer 160 is any one of a silicon nitride layer, a silicon oxide layer, or an overlapping layer of silicon nitride and silicon oxide.

Figure 11:
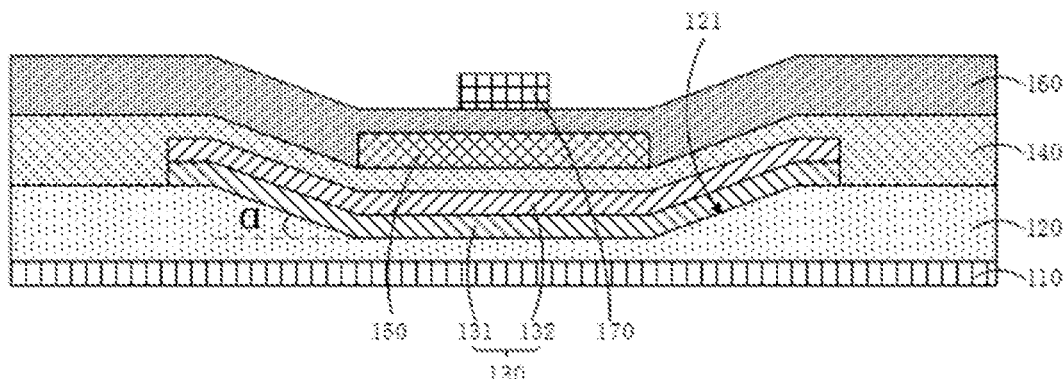

As shown in FIGS. 4 and 11, a step S7 of depositing a metal material on the gate insulation layer 160, and patterning the metal material to form a gate 170, where, the gate 170 is correspondingly formed right above the active layer 150. The preparation material of the gate 170 includes at least one of molybdenum, aluminum, titanium, chromium, and copper.

Figure 12:
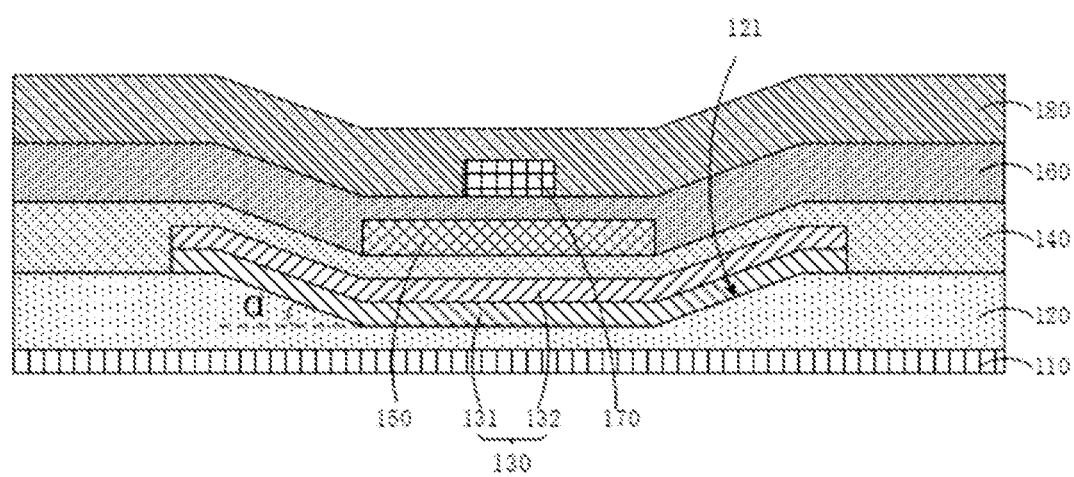

As shown in FIGS. 4 and 12, a step S8 of depositing an insulating material on the gate 170 to form an interlayer insulation layer 180.

Figure 13:
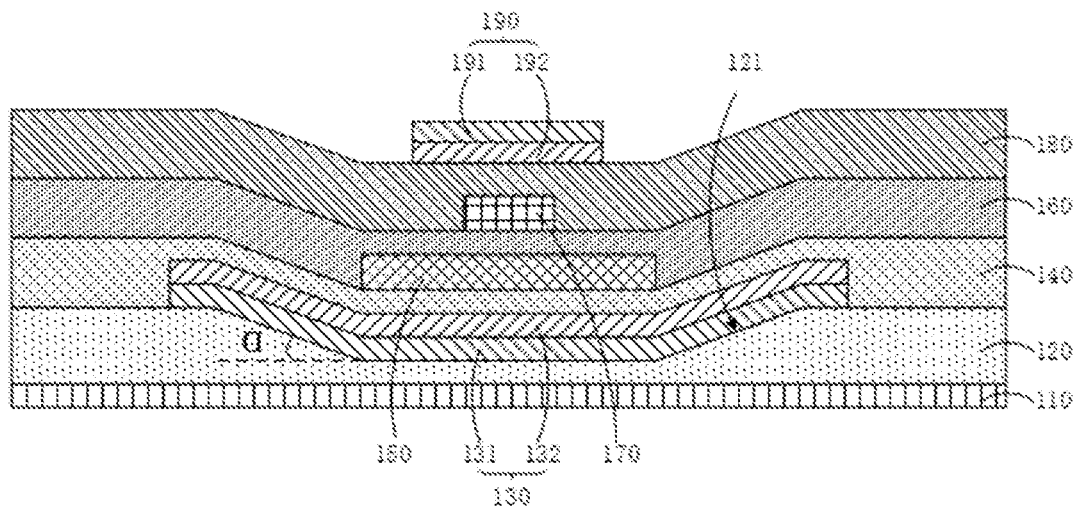

As shown in FIGS. 4 and 13, a step S9 of depositing a metal oxide material and a metal material on the interlayer insulation layer 180, respectively, and patterning the metal oxide material and the metal material to form a second filter layer 190, where, the second filter layer 190 includes at least one second metal layer 191 and at least one second metal oxide layer 192, and the second metal oxide layer 192 is disposed close to the interlayer insulation layer 180. The material of the second metal layer 191 includes titanium, and the material of the second metal oxide layer 192 includes titanium oxide.

Figure 14:
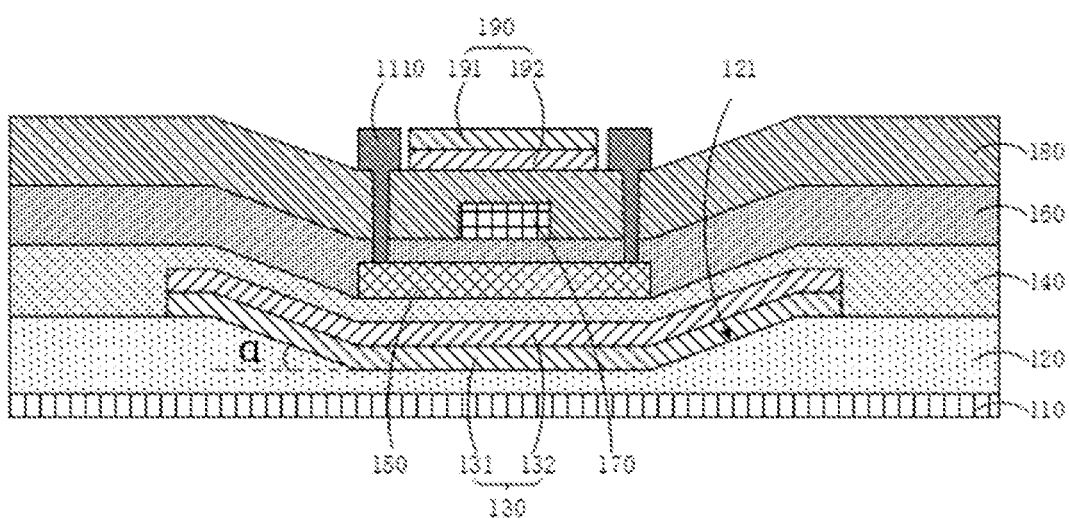

As shown in FIGS. 4 and 14, a step S10 of forming a via passing through the interlayer insulation layer 180 and the gate insulation layer 160 on the interlayer insulation layer 180 to expose a portion of the active layer 150, then depositing a metal material on the interlayer insulation layer 180, and patterning the metal material to cover the exposed portion of the active layer 150, so as to form a source/drain 1110, where, the source/drain 1110 is connected to the active layer 150. The interlayer insulation layer 180 serves to insulate the source/drain 1110 and the gate 170 from other conductive layers. It can be understood that the second filter layer 190 and the source/drain 1110 are disposed on the same layer, and both are disposed on the interlayer insulation layer 180. The source/drain 1110 is wet-etched. Since the material of the source/drain 1110 is different from that of the second filter layer 190, the etching solution does not etch the second filter layer 190 while the source/drain electrode 1110 is etched, so that the second filter layer 190 is disposed on the same layer as the source/drain 1110 to reduce the thickness of the array substrate 10.

Figure 15:
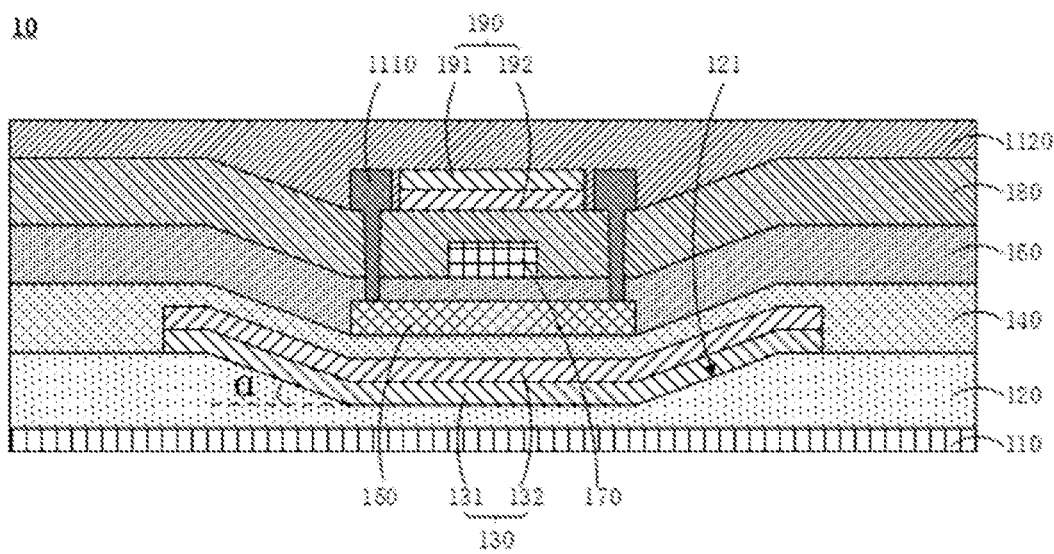

As shown in FIGS. 4 and 15, a step S11 of depositing an insulating material on the second filter layer 190 to cover the interlayer insulation layer 180, the second filter layer 190, and the source/drain 1110 so as to form a flat layer 1120. The flat layer 1120 serves to planarize the devices in the array substrate 10 to facilitate the preparation of other film layers in a subsequent process.

In the embodiment, a specific preparation method of each of the film layers may be a conventional method in the art. By integrating the first filter layer 130 and the second filter layer 190 to the array substrate in the embodiment, ambient light can be incident on the array substrate 10. By first reflecting the light to the second filter layer 190 through the first filter layer 130, and then reflecting the light to the active layer 150 through the second filter layer 190, the active layer can act as a photosensitive unit to meet a requirement for detecting an ultraviolet intensity in the ambient light.

Figure 16:
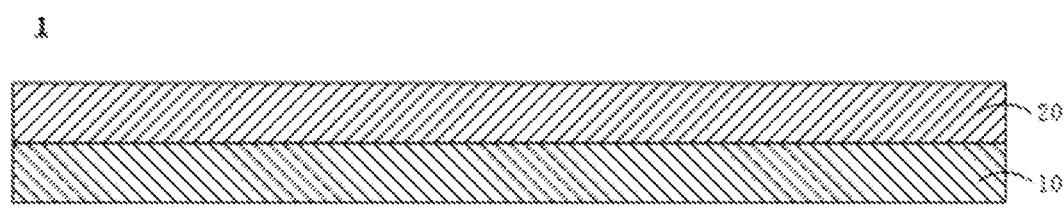
FIG. 16 is a schematic structural diagram of a display panel according to an embodiment of the present disclosure.

Referring to FIG. 16, an embodiment of the present disclosure further provides a display panel 1 including the array substrate 10 and an opposite substrate 20 disposed opposite to the array substrate 10. It can be understood that the display panel 1 further includes some other conventional film layers, and details thereof are not described repeatedly herein. Specifically, the display panel 1 described in the embodiment of the present disclosure can be applied to any product or component having a display function, such as a mobile phone, a tablet computer, a television, a display, a notebook computer, a digital photo frame, a navigator, or the like. Other essential components of the display panel 1 are to be understood by those of ordinary skill in the art, and are not repeated herein, and should not be construed as limiting the disclosure.

An embodiment of the present disclosure provides an array substrate including a base substrate 110, a first buffer layer 120, a first filter layer 130, a second buffer layer 140, an active layer 150, a gate insulation layer 160, a gate 170, an interlayer insulation layer 180, a second filter layer 190, a source/drain 1110, and a flat layer 1120 that are sequentially disposed in a laminated manner. By integrating the first filter layer 130 and the second filter layer 190 to the array substrate, ambient light can be incident on the array substrate. By first reflecting the light to the second filter layer 190 through the first filter layer 130, and then reflecting the light to the active layer 150 through the second filter layer 190, the active layer 150 can act as a photosensitive unit to meet a requirement for detecting an ultraviolet intensity in the ambient light. The present disclosure can directly prepare the ultraviolet detection structure on the array substrate, so there is no need to perform a process of fixing the ultraviolet detection structure to the display device, thereby avoiding a risk of damage to the display device during the fixing process, and solving a problem that the current ultraviolet detection requires a filter to be introduced. The preparation process of the present disclosure is simpler, thereby saving a production cost.

Further, the first buffer layer 120 is provided with the groove 121, the orthographic projection of the active layer 150 on the base substrate 110 is located in the orthographic projection of the first filter layer 130 on the base substrate 110, and the second filter layer 190 is disposed in correspondence with the active layer 150. That is, the orthographic projection of the second filter layer 190 on the base substrate 110 is located in the orthographic projection of the first filter layer 130 on the base substrate 110. When the groove 121 has the inverse trapezia section, the outer periphery of the first filter layer 130 has an inclined surface which serves to converge light. That is, it is easier to reflect the ambient light to the second filter layer 190, and reflecting more light can absorb more ambient light on the active layer 150, thereby realizing the need for detecting the ultraviolet intensity in the ambient light.

In the foregoing embodiments, descriptions of the embodiments are emphasized. A portion that is not described in detail in an embodiment may refer to related descriptions in another embodiment.

The array substrate 10 and the display panel 1 provided in the embodiments of the present disclosure are described in detail above. A specific example is used herein to describe a principle and an implementation of the present disclosure. The description of the foregoing embodiments is merely used to help understand a method and a core idea of the present disclosure. In addition, a person skilled in the art may make changes in a specific implementation manner and an application scope according to an idea of the present disclosure. In conclusion, content of this specification should not be construed as a limitation on the present disclosure.

What is claimed is:

1. An array substrate, comprising:
a base substrate;
a first buffer layer disposed on a side of the base substrate and having a groove;
a first filter layer disposed on a side of the first buffer layer away from the base substrate and covering the groove;
an active layer disposed on a side of the first filter layer away from the first buffer layer and overlapping the first filter layer;
a second filter layer disposed on a side of the active layer away from the first filter layer and overlapping the active layer; and
a source/drain disposed on a side of the active layer away from the first filter layer and connected to the active layer through a via; wherein
an orthographic projection of the active layer on the base substrate is within an orthographic projection of the first filter layer on the base substrate;
the second filter layer is disposed on the same layer as the source/drain; and
a shape of an orthographic projection of the second filter layer on the base substrate includes a cross shape; the orthographic projection of the second filter layer on the base substrate exposes four corners of the orthographic projection of the active layer on the base substrate; and a source/drain is connected to the active layer at positions of the four corners.

2. The array substrate of claim 1, wherein the groove has an inverse trapezia section, and a range of an angle between a sidewall of the groove and the base substrate is 0 to 60 degrees.

3. The array substrate of claim 1, wherein the first filter layer includes at least one first metal layer and at least one first metal oxide layer, wherein the first metal layer is disposed close to the first buffer layer; and
the second filter layer includes at least one second metal layer and at least one second metal oxide layer, wherein the second metal oxide layer is disposed close to the active layer.

4. The array substrate of claim 3, wherein materials of the first metal layer and the second metal layer include titanium, and materials of the first metal oxide layer and the second metal oxide layer include titanium oxide.

5. The array substrate of claim 3, wherein both the first metal layer and the second metal layer have a thickness ranging from 40 nm to 300 nm, and both the first metal oxide layer and the second metal oxide layer have a thickness ranging from 10 nm to 500 nm.

6. The array substrate of claim 1, wherein an orthographic projection of the second filter layer on the base substrate is within an orthographic projection of the first filter layer on the base substrate; and
an orthographic projection of the second filter layer on the active layer covers at least a portion of the active layer.

7. The array substrate of claim 1, wherein the array substrate further comprises:
a second buffer layer disposed on a side of the first filter layer away from the first buffer layer and covering the first buffer layer and the first filter layer;
a gate insulation layer disposed on a side of the active layer away from the second buffer layer and covering the second buffer layer and the active layer;
a gate disposed on a side of the gate insulation layer away from the active layer and overlapping the active layer;
an interlayer insulation layer disposed on a side of the gate away from the gate insulation layer and covering the gate insulation layer and the gate;
and
a flat layer disposed on a side of the second filter layer away from the interlayer insulation layer and covering the interlayer insulation layer, the second filter layer, and the source/drain.

8. A method for preparing an array substrate, comprising:
providing a base substrate;
depositing an insulating material on the base substrate and patterning the insulating material to form a groove, so as to form a first buffer layer;
depositing a metal material and a metal oxide material on the first buffer layer, respectively, and patterning the metal material and the metal oxide material to form a first filter layer, wherein the first filter layer covers the groove;
depositing a polysilicon material on the first filter layer, and patterning the polysilicon material to form an active layer, wherein the active layer is formed right above the first filter layer, and an orthographic projection of the active layer on the base substrate is within an orthographic projection of the first filter layer on the base substrate;
depositing a metal oxide material and a metal material on the active layer, respectively, and patterning the metal oxide material and the metal material to form a second filter layer, such that an orthographic projection of the second filter layer on the active layer covers at least a portion of the active layer; and
depositing a metal material on the active layer, and patterning the metal material to form a source/drain; wherein:
the source/drain is connected to the active layer through a via;
the second filter layer is disposed on the same layer as the source/drain; and
a shape of an orthographic projection of the second filter layer on the base substrate includes a cross shape; the orthographic projection of the second filter layer on the base substrate exposes four corners of the orthographic projection of the active layer on the base substrate; and a source/drain is connected to the active layer at positions of the four corners.

9. A display panel, comprising an array substrate and an opposing substrate disposed opposite to the array substrate, wherein the array substrate comprises:
a base substrate;
a first buffer layer disposed on a side of the base substrate and having a groove;
a first filter layer disposed on a side of the first buffer layer away from the base substrate and covering the groove;
an active layer disposed on a side of the first filter layer away from the first buffer layer and overlapping the first filter layer;
a second filter layer disposed on a side of the active layer away from the first filter layer and overlapping the active layer; and
a source/drain disposed on a side of the active layer away from the first filter layer and connected to the active layer through a via;
wherein an orthographic projection of the active layer on the base substrate is within an orthographic projection of the first filter layer on the base substrate; and the second filter layer is disposed on the same layer as the source/drain; and wherein a shape of an orthographic projection of the second filter layer on the base substrate includes a cross shape; the orthographic projection of the second filter layer on the base substrate exposes four corners of the orthographic projection of the active layer on the base substrate; and a source/drain is connected to the active layer at positions of the four corners.

10. The display panel of claim 9, wherein the groove has an inverse trapezia section, and a range of an angle between a sidewall of the groove and the base substrate is 25 to 45 degrees.

11. The display panel of claim 9, wherein the first filter layer comprises at least one first metal layer and at least one first metal oxide layer, wherein the first metal layer is disposed close to the first buffer layer.

12. The display panel of claim 11, wherein a material of the first metal layer comprises titanium, and a material of the first metal oxide layer comprises titanium oxide; and the first metal layer has a thickness ranging from 50 nm to 200 nm; and the first metal oxide layer has a thickness ranging from 20 nm to 400 nm.

13. The display panel of claim 9, wherein the second filter layer comprises at least one second metal layer and at least one second metal oxide layer, wherein the second metal oxide layer is disposed close to the interlayer insulation layer.

14. The display panel of claim 13, wherein a material of the second metal layer comprises titanium, and a material of the second metal oxide layer comprises titanium oxide; and the second metal layer has a thickness ranging from 50 nm to 200 nm; and the second metal oxide layer has a thickness ranging from 20 nm to 400 nm.

15. The display panel of claim 9, wherein an orthographic projection of the second filter layer on the base substrate is within an orthographic projection of the first filter layer on the base substrate; and an orthographic projection of the second filter layer on the active layer covers at least a portion of the active layer.

16. The display panel of claim 9, wherein an orthographic projection of the source/drain on the base substrate is located within an orthographic projection of the first filter layer on the base substrate; and an orthographic projection of the source/drain on the active layer covers at least a portion of the active layer.

17. The display panel of claim 9, wherein the array substrate further comprises:

a second buffer layer disposed on a side of the first filter layer away from the first buffer layer and covering the first buffer layer and the first filter layer;

a gate insulation layer disposed on a side of the active layer away from the second buffer layer and covering the second buffer layer and the active layer;

a gate disposed on a side of the gate insulation layer away from the active layer and overlapping the active layer;

an interlayer insulation layer disposed on a side of the gate away from the gate insulation layer and covering the gate insulation layer and the gate; and a flat layer disposed on a side of the second filter layer away from the interlayer insulation layer and covering the interlayer insulation layer, the second filter layer, and the source/drain.

\* \* \* \* \*